United States Patent [19]
Kawasumi

[11] Patent Number: 6,087,788
[45] Date of Patent: Jul. 11, 2000

[54] HORIZONTAL SCANNING PULSE SIGNAL CONTROL CIRCUIT USING DIGITAL CIRCUIT

[75] Inventor: Takafumi Kawasumi, Yamagata, Japan

[73] Assignee: NEC Corporation, Tokyo, Japan

[21] Appl. No.: 09/160,566

[22] Filed: Sep. 25, 1998

[30] Foreign Application Priority Data

Sep. 29, 1997 [JP] Japan ................................ 9-263422

[51] Int. Cl.[7] .............................. H01J 29/70; H01N 5/06; H03L 7/00; G09G 1/04
[52] U.S. Cl. .......................... 315/364; 348/521; 348/540
[58] Field of Search ..................................... 315/364, 365, 315/367, 370; 348/540, 541, 500, 521

[56] References Cited

U.S. PATENT DOCUMENTS

| | | | |
|---|---|---|---|
| 4,352,047 | 9/1982 | Imayasu et al. | 315/370 |
| 6,005,634 | 12/1999 | Lam et al. | 348/541 |

*Primary Examiner*—Seungsook Ham
*Assistant Examiner*—John Patti
*Attorney, Agent, or Firm*—Scully, Scott, Murphy & Presser

[57] ABSTRACT

In a horizontal scanning pulse control circuit, a reference clock generation circuit generates a reference clock signal in synchronization with a horizontal synchronization signal. First and second horizontal position reference pulse generation circuits generates first and second horizontal position reference pulse signals, respectively, whose phases are different with reference to the horizontal synchronization signal and corresponding to first and second pulses of said reference clock signal. First and second saw-tooth wave generation circuits generate first and second saw-tooth wave signals in response to the first and second horizontal position reference signals, respectively. First and second comparators, compare the first and second saw-tooth wave signals with a horizontal position selection voltage to generate first and second comparison signals, respectively. An RS-type flip-flop is set and reset by the first and second comparison signals, respectively. An output signal of the RS-type flip-flop is used as a horizontal scanning pulse signal.

6 Claims, 14 Drawing Sheets

HORIZONTAL SCANNING PULSE SIGNAL CONTROL CIRCUIT USING DIGITAL CIRCUIT

BACKGROUND OF THE INVENTION

1. Field of the Invention

The present invention relates to a horizontal scanning pulse signal control circuit used in a multi-scan type display apparatus adapted to a plurality of different scanning frequencies.

2. Description of the Related Art

A prior art horizontal scanning pulse signal control circuit is constructed by a delay circuit for receiving a horizontal synchronization signal to generate a delayed pulse signal in accordance with a horizontal position control voltage signal, a saw-tooth wave generation circuit which generates a saw-tooth wave signal, a comparator for comparing the saw-tooth wave signal with a pulse width selection voltage, and an AND circuit, connected to the comparator and the delay circuit, for generating a horizontal scanning pulse signal. This will be explained later in detail.

In the above-described prior art horizontal scanning pulse signal control circuit, however, the inclination of the saw-tooth wave signal is directly affected by the variations in the performances of the various elements of the saw-tooth wave generation circuit including capacitors and resistors to vary the pulse width of the horizontal scanning pulse signal and hence adversely affect the dimensions of the image displayed on the screen.

SUMMARY OF THE INVENTION

It is an object of the present invention to stabilize the pulse width of a horizontal scanning pulse signal in a horizontal scanning pulse signal control circuit.

According to the present invention, in a horizontal scanning pulse control circuit, a reference clock generation circuit generates a reference clock signal in synchronization with a horizontal synchronization signal. First and second horizontal position reference pulse generation circuits generate first and second horizontal position reference pulse signals, respectively, whose phases are different with reference to the horizontal synchronization signal and corresponding to first and second pulses of said reference clock signal. First and second saw-tooth wave generation circuits generate first and second saw-tooth wave signals in response to the first and second horizontal position reference signals, respectively. First and second comparators, compare the first and second saw-tooth wave signals with a horizontal position selection voltage to generate first and second comparison signals, respectively. An RS-type flip-flop is set and reset by the first and second comparison signals, respectively. An output signal of the RS-type flip-flop is used as a horizontal scanning pulse signal.

BRIEF DESCRIPTION OF THE DRAWINGS

The present invention will be more clearly understood from the description as set below, as compared with the prior art, with reference to the accompanying drawings, wherein.

DESCRIPTION OF THE PREFERRED EMBODIMENTS

Before the description of the preferred embodiments, a prior art horizontal scanning pulse control circuit will be explained with reference to FIGS. 1, 2A, 2B, 3A, 3B, 4A through 4E and 5.

Figure 1:
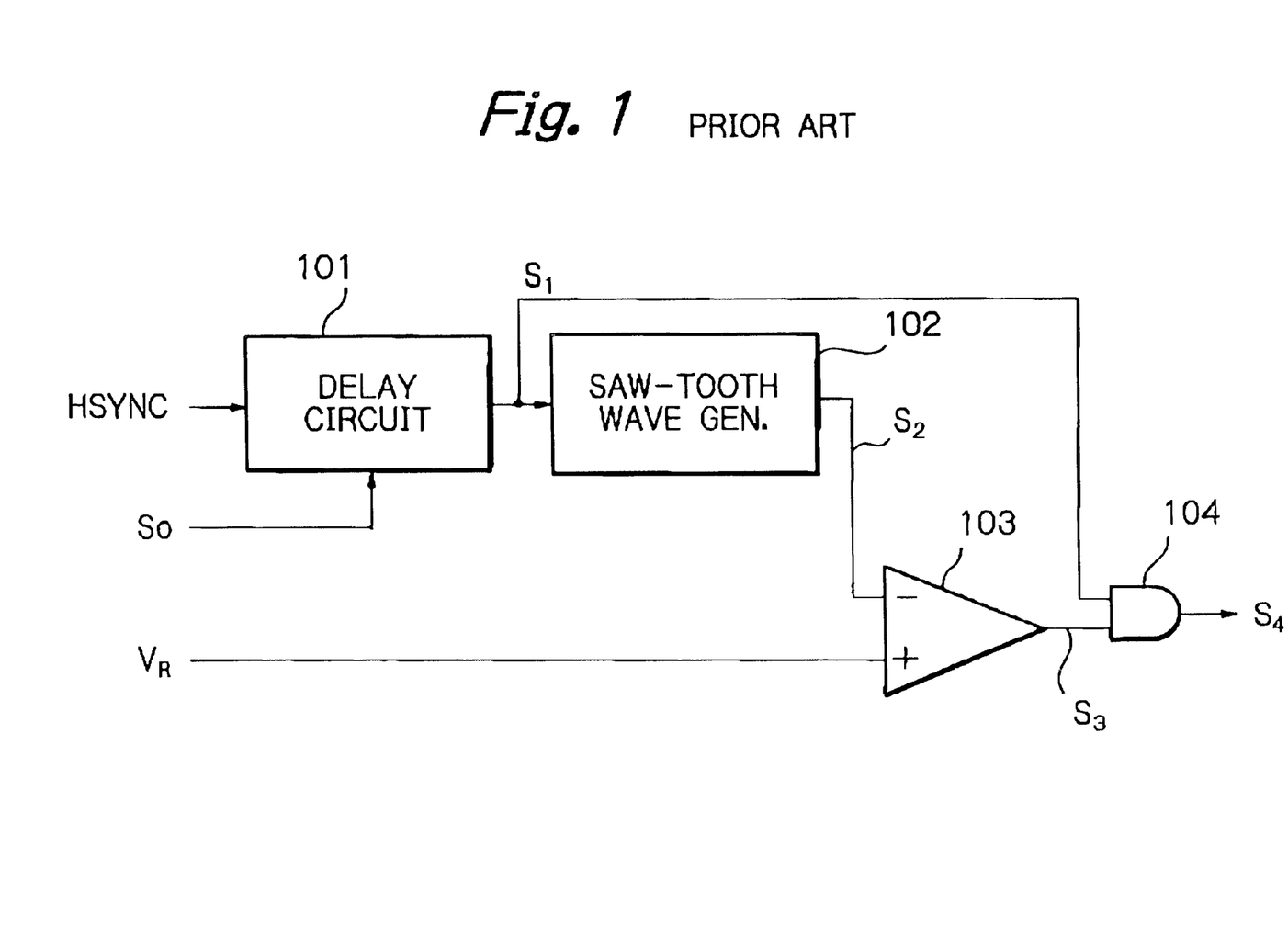
FIG. 1 is a block circuit diagram illustrating a prior art horizontal scanning pulse signal control circuit.

In FIG. 1, which illustrates a prior art horizontal scanning pulse signal control circuit, reference numeral 101 designates a delay circuit for receiving a horizontal synchronization signal HSYNC to generate a delayed pulse signal $S_1$ in accordance with a horizontal position control voltage signal $S_0$.

Figure 2A:
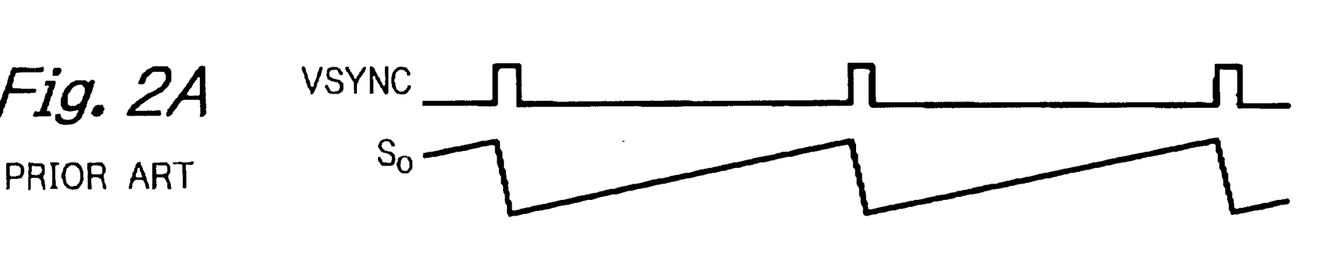
FIG. 2A is a timing diagram for showing an example of the horizontal position control voltage signal of FIG. 1.
Figure 2B:
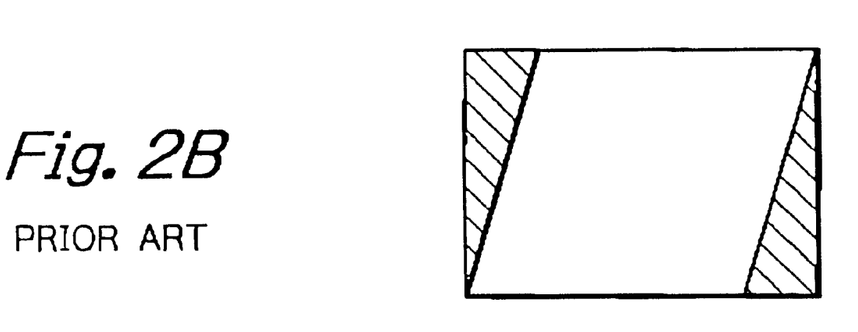
FIG. 2B is a diagram showing a corrected displayed image when the horizontal position control voltage signal is as shown in FIG. 2A.
Figure 3A:
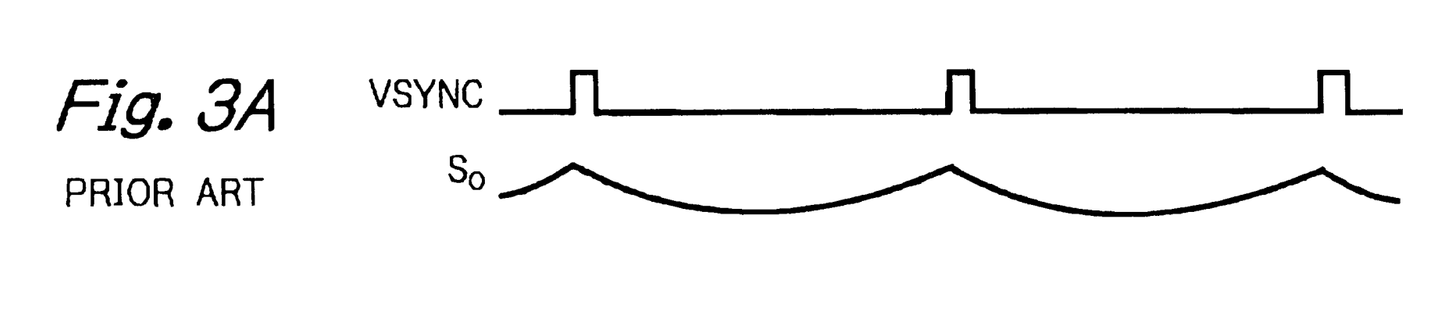
FIG. 3A is a timing diagram for showing another example of the horizontal position control voltage signal of FIG. 1.
Figure 3B:
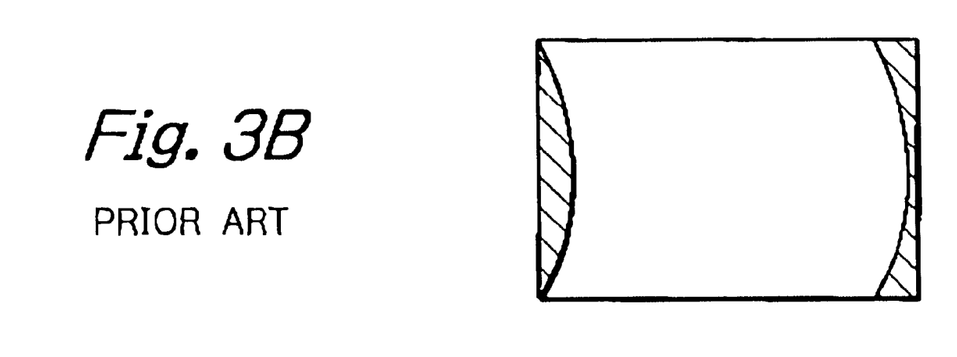
FIG. 3B is a diagram showing a corrected displayed image when the horizontal position control voltage signal is as shown in FIG. 3A.

The horizontal position control voltage signal $S_0$ uses a deflection correction waveform for determining the horizontal phase. For example, if the horizontal position control voltage signal $S_0$ is a vertically-synchronized saw-tooth wave signal as shown in FIG. 2A, the horizontal phase is shifted in synchronization with a vertical synchronization signal VSYNC, so that a pallalelogrammatic correction as shown in FIG. 2B is performed upon a displayed image. On the other hand, if the horizontal position control voltage signal $S_0$ is a vertically-synchronized parabolic wave signal as shown in FIG. 3A, the horizontal phase is shifted in synchronization with a vertical synchronization signal VSYNC, so that a laterally pin-balanced correction as shown in FIG. 3B is performed upon a displayed image.

Figures 4A, 4B:
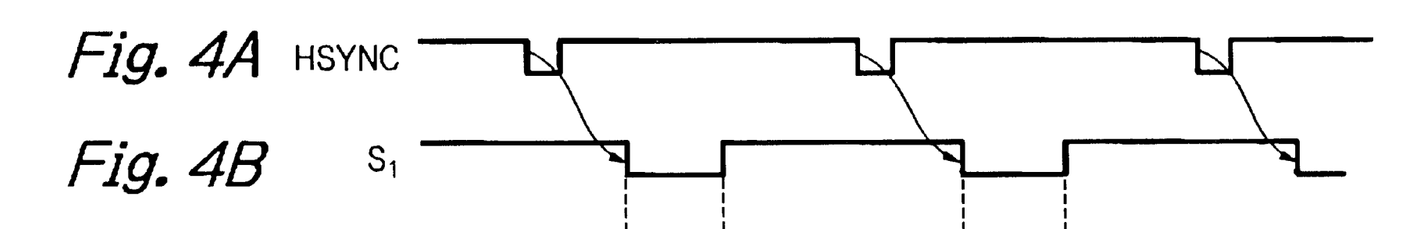
FIGS. 4A, 4B, 4C, 4D and 4E are timing diagrams showing the operation of the horizontal scanning signal control circuit of FIG. 1.
Figures 4C, 4D:
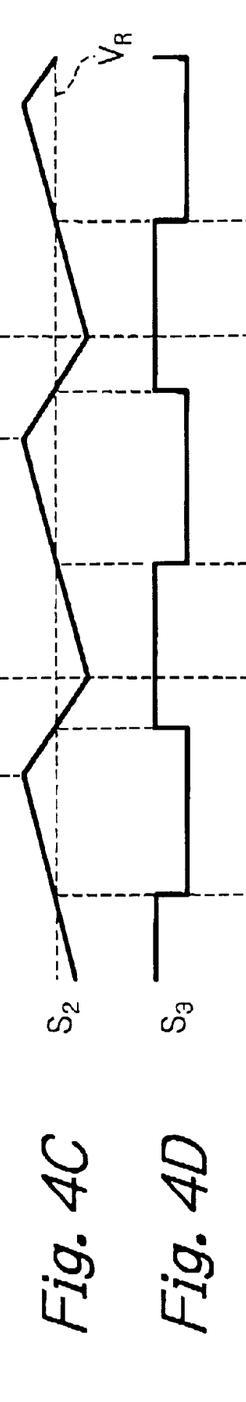

If the horizontal synchronization signal HSYNC is as shown in FIG. 4A, the delay pulse signal $S_1$ is as shown in FIG. 4B. The delay pulse signal $S_1$ is supplied to a saw-tooth wave generation circuit 102 which generates a saw-tooth wave signal $S_2$ as shown in FIG. 4C. A comparator 103 compares the saw-tooth wave signal $S_2$ with a pulse width selection voltage $V_R$ as shown in FIG. 4C, so that a pulse signal $S_3$ as shown in FIG. 4D is generated from the comparator 103. Thus, the pulse signal $S_3$ having a desired pulse width can be generated by controlling the pulse width selection voltage $V_R$.

Figure 4E:
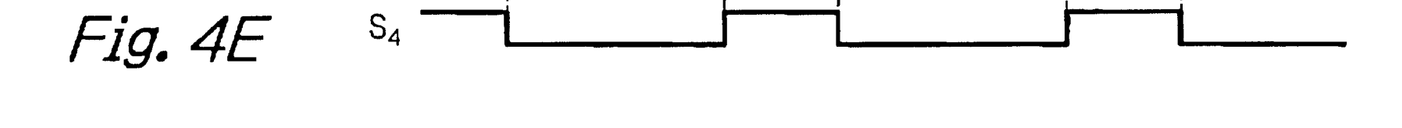

Further, the delayed pulse signal $S_1$ and the pulse signal $S_3$ are supplied to an AND circuit 104 which generates a horizontal scanning pulse signal $S_4$ as shown in FIG. 4E.

Figure 5:
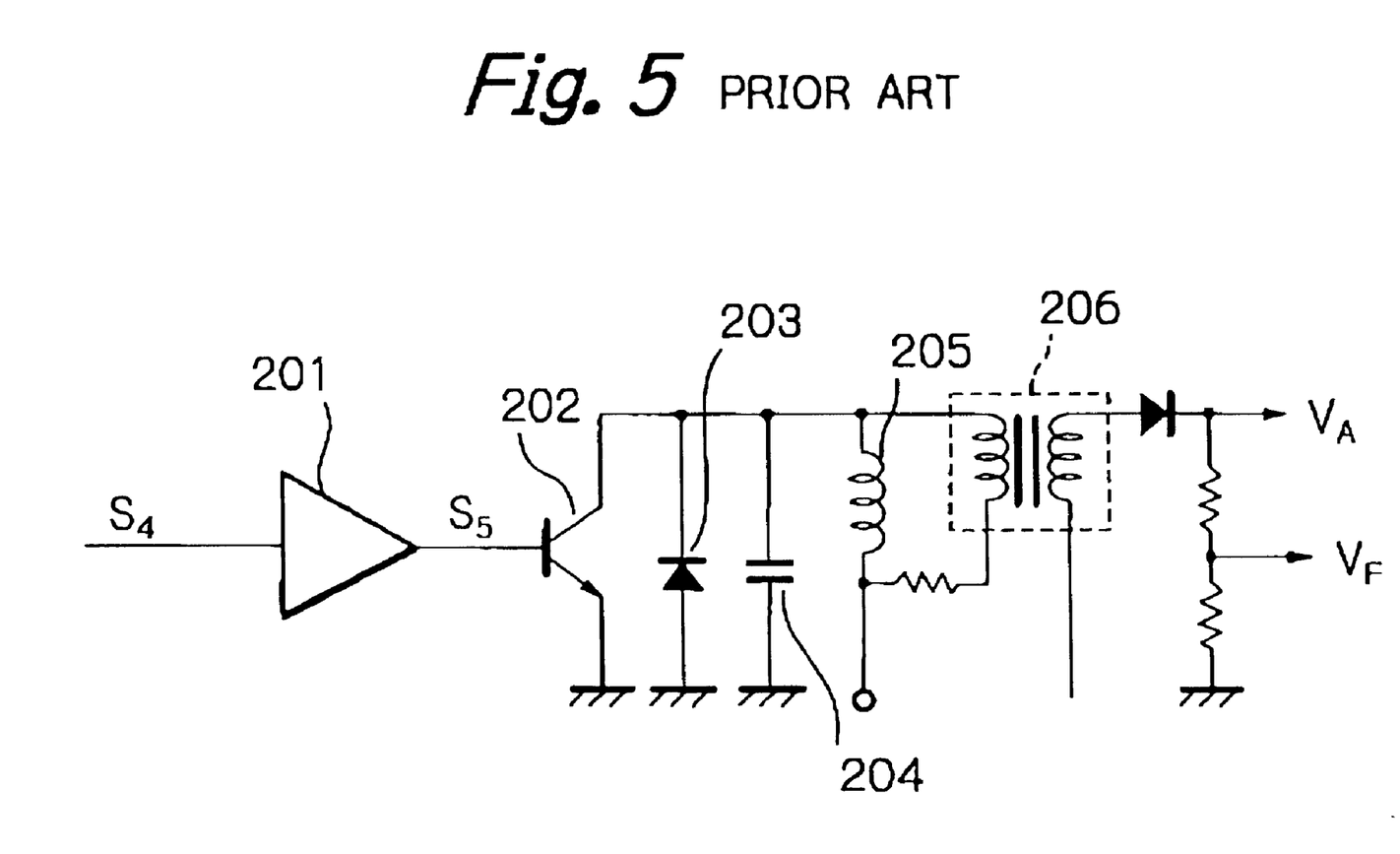
FIG. 5 is a block circuit diagram illustrating a prior art scanning signal drive circuit.

In FIG. 5, which illustrates a prior art horizontal scanning signal drive circuit, the pulse signal $S_4$ of the horizontal scanning pulse signal control circuit of FIG. 1 is input to an amplifier 201, and an amplified signal $S_5$ is then input as a horizontal deflection drive pulse signal to the base of a transistor 202. The transistor 202 is operated as a switch by means of the horizontal deflection drive pulse and causes a saw-tooth wave current to flow to a deflection winding 205 due to a combined effect of a diode 203 and a capacitor 204. The saw-tooth wave current is used as a deflection current of a image receiving tube or an cathode ray tube (CRT) for carrying out a horizontal scanning operation. Thus, the horizontal scanning operation can be controlled by controlling the horizontal deflection drive pulse signal $S_5$.

A multi-scan type display apparatus requires that the horizontal deflection drive pulse signal $S_5$ is regulated for the phase and the pulse width in order for the CRT to display an image at a central area of the CRT because the phasic relationship between the horizontal synchronization signal and the image to be displayed varies in many ways as it receives image signals having different scanning frequencies for display.

The horizontal scanning pulse signal $S_4$ is input to the horizontal scanning signal drive circuit of FIG. 5, and takes not only the role of causing a deflection current to flow in order to make an electron beam scan horizontally but also the role of causing the secondary high voltage winding of a flyback transformer 206 to generate a high voltage pulse and feeding the anode and the focusing electrode of the CRT with high voltages $V_A$ and $V_P$.

Thus, if the horizontal scanning pulse signal $S_4$ shows a varying pulse width, the electric potentials of the high voltages also vary. Then, if the high voltages vary, the horizontal dimension of the image displayed on the screen varies.

In the horizontal scanning pulse signal control circuit of FIG. 1, however, the inclination of the saw-tooth wave signal $S_2$ is directly affected by the variations in the performances of the various elements of the saw-tooth wave generation circuit 102 including capacitors and resistors to vary the pulse width of the horizontal scanning pulse signal $S_4$ and hence adversely affect the dimensions of the image displayed on the screen. Therefore, it is necessary to provide some means for stabilizing the pulse width of the horizontal scanning pulse signal $S_4$.

Figure 6:
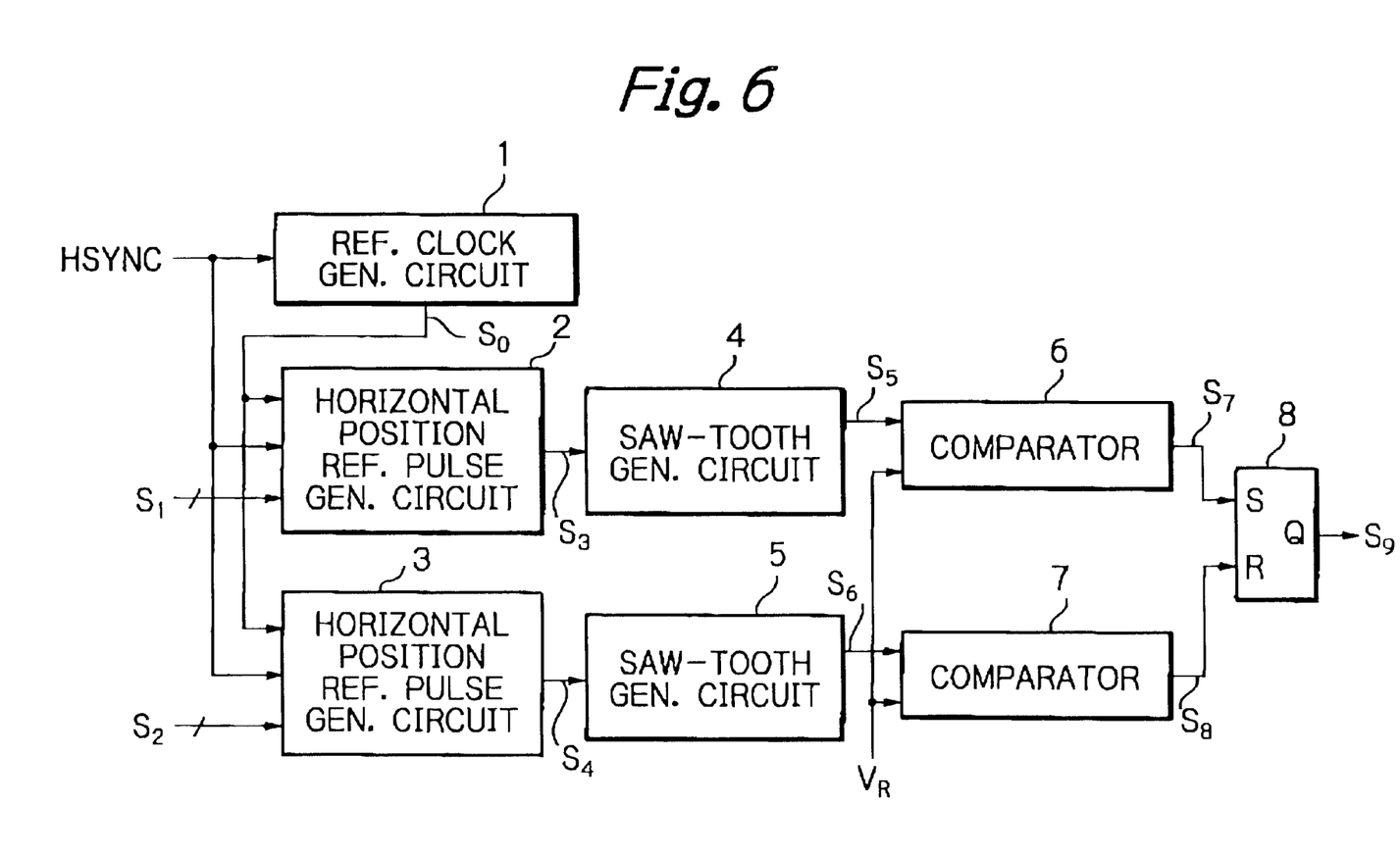
FIG. 6 is a block circuit diagram illustrating a first embodiment of the horizontal scanning pulse signal control circuit according to the present invention.

In FIG. 6, which is a first embodiment of the horizontal scanning pulse signal control circuit according to the present invention, a horizontal synchronization signal HSYNC is input to a reference clock generation circuit 1, which generates a reference clock signal $S_0$ in synchronization with the horizontal synchronization signal HSYNC and having a frequency obtained by multiplying the frequency of the horizontal synchronization signal HSYNC.

The reference clock signal $S_0$ and the horizontal synchronization signal HSYNC are input to horizontal position reference pulse generation circuits 2 and 3 which have the same configuration. Also, the horizontal position reference pulse generation circuits 2 and 3 receive a horizontal position signal $S_1$ and a horizontal pulse width signal $S_2$, respectively. As a result, the horizontal position reference pulse generation circuits 2 and 3 generate respective pulse signals $S_3$ and $S_4$ whose phases are differentiated from each other. The reference pulse signals $S_3$ and $S_4$ are then respectively input to saw-tooth wave generation circuits 4 and 5, respectively. The saw-tooth wave generation circuits 4 and 5 have the same configuration, and generate saw-tooth wave signals $S_5$ and $S_6$, respectively, having a cycle period equal to that of the horizontal synchronizing signal and different respective phases.

The two saw-tooth wave signals $S_5$ and $S_6$ are then input to comparators 6 and 7, respectively. Each of the comparators 6 and 7 outputs a high level signal only when the voltage level of the saw-tooth wave signal it receives becomes higher than a horizontal position selection reference voltage $V_R$ it receives at the other input. The two output signals $S_7$ and $S_8$ of the comparators 6 and 7 are then respectively input to the set input and the reset input of an RS flip-flop 8. The output signal of the RS flip-flop 8 is used as a horizontal scanning pulse signal $S_9$.

Figure 7:
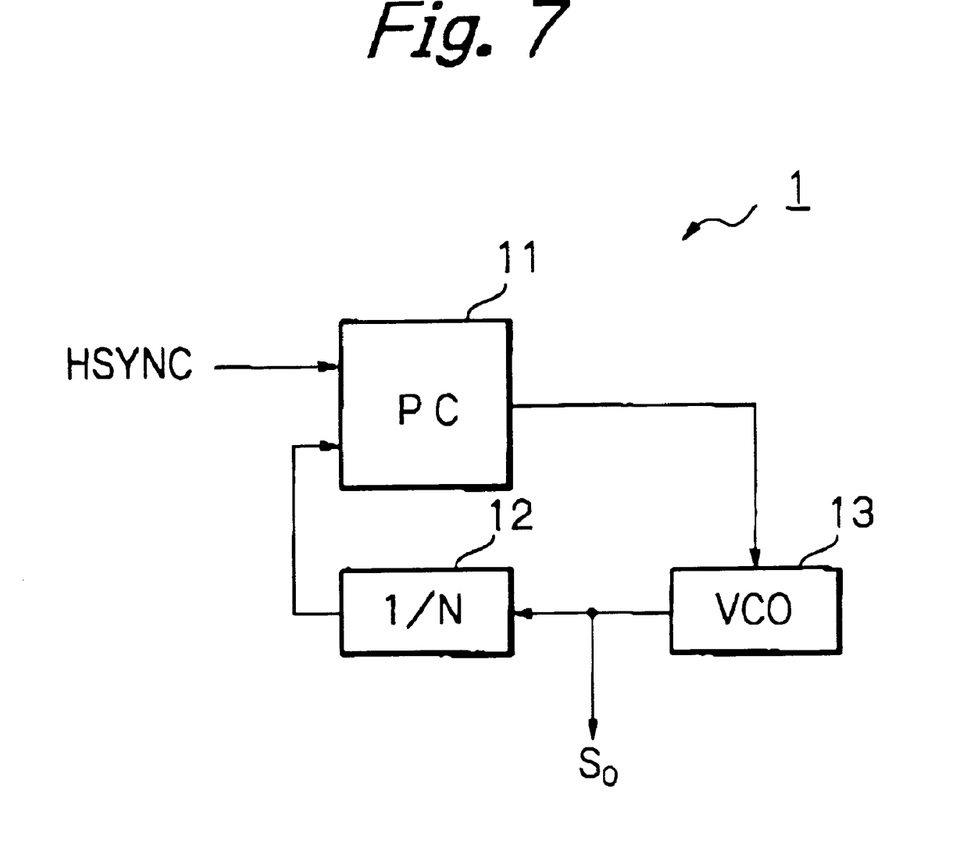
FIG. 7 is a detailed block circuit diagram of the reference clock signal generation circuit of FIG. 6.

In FIG. 7, which is a detailed block circuit diagram of the reference clock generation circuit 1 of FIG. 6, the reference clock generation circuit 1 is a phase-locked loop (PLL) circuit formed by a phase comparator 11 for comparing the phase of the horizontal synchronization signal HSYNC with the phase of a signal obtained by dividing the frequency of the reference clock signal $S_0$ by means of a 1/N frequency divider 12 and a voltage controled oscillator (VCO) 13 to be controlled by the output signal of the phase comparator 11.

Figure 8:
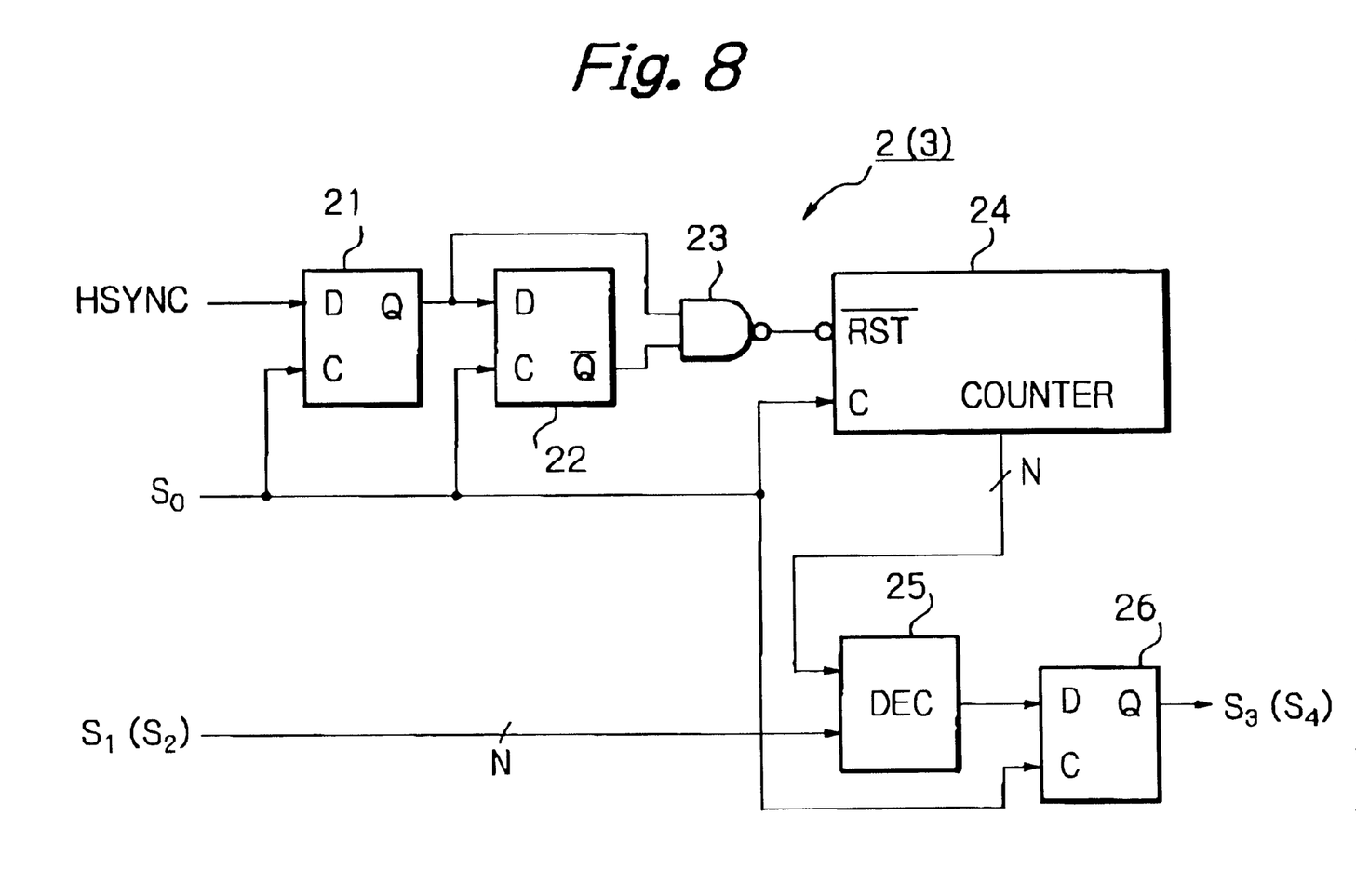
FIG. 8 is a detailed block circuit diagram of the horizontal position reference pulse signal generation circuits of FIG. 6.
Figure 9A:
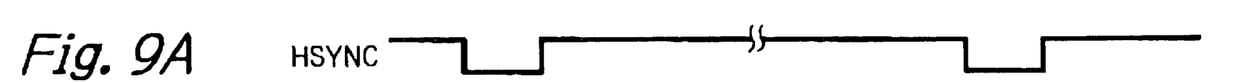
FIGS. 9A through 9J are timing diagrams for showing the operation of the horizontal position reference pulse signal generation circuits of FIG. 8.
Figures 9B, 9C:
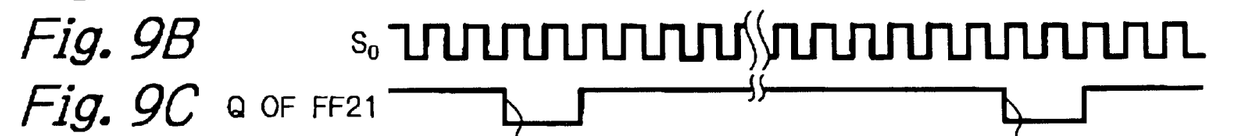
Figure 9D:
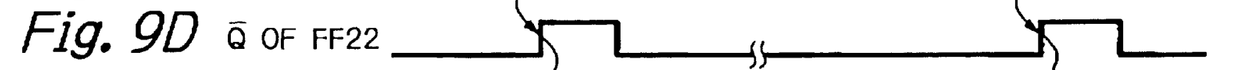
Figure 9E:
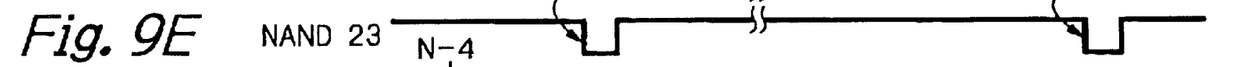

In FIG. 8, which is a detailed block circuit diagram of the horizontal position reference pulse generation circuit 2(3) of FIG. 6, the horizontal synchronization signal HSYNC as shown in FIG. 9A is input to the data input of a D-type flip-flop 21. The Q output of the D-type flip-flop 21 is input to the data input of a D-type flip-flop 22. The D flip-flops 21 and 22 are clocked by the reference clock signal $S_0$ as shown in FIG. 9B. Two-input NAND circuit 23 receives the Q output of the D-type flip-flop 21 as shown in FIG. 9C and the negative Q output of the D-type flip-flop 22 as shown in FIG. 9D, and outputs a pulse signal as shown in FIG. 9E having a predetermined clock width at a rising edge of the horizontal synchronization signal HSYNC, which pulse signal is then input to the inverted reset input of a counter 24.

Figure 9F:
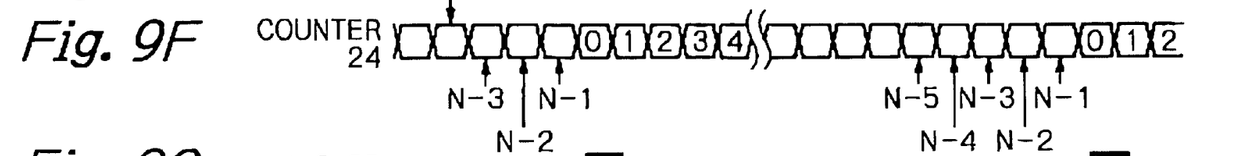

The reference clock signal $S_0$ is also input to the counting clock input of the counter 24. The count output of the counter 24 generates an N-bit count output for showing a number of pulses of the reference clock signal $S_0$ reset by using the rising edge of the horizontal synchronization signal HSYNC, as shown in FIG. 9F. The number N of pulses of the counter 24 may be the same as that of the frequency divider 12 of FIG. 7 because it requires the number of bits corresponding to a period of the horizontal synchronization signal HSYNC. The count output of the counter 24 is input to one of the input terminals of a decoder 25. The other one of the input terminals of the decoder 25 receives the horizontal position signal $S_1$ (the horizontal pulse width signal $S_2$) to be used for determining the reference pulse position. The count output of the counter 24 is input to the decoder 25. When the count output of the counter 25 is found equal to that of the signal $S_1(S_2)$, the decoder 25 generates a pulse signal and transmits it to a D-type flip-flop 26 which is clocked by the reference clock signal $S_0$.

Figure 9G:
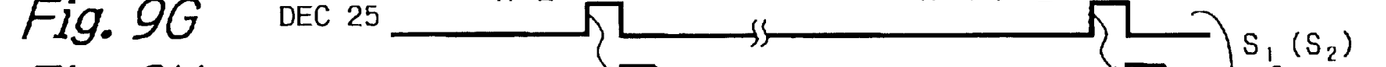
Figure 9H:
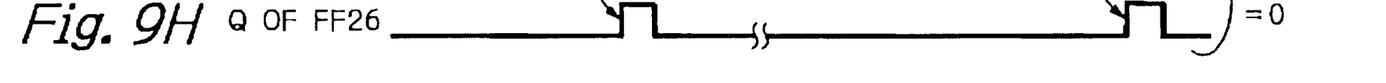
Figure 9I:
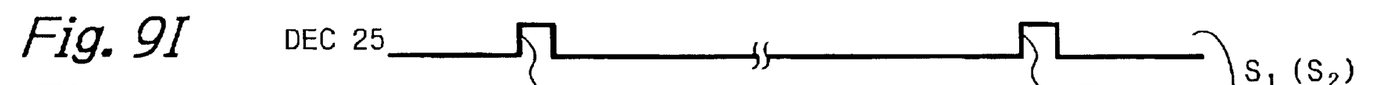
Figure 9J:
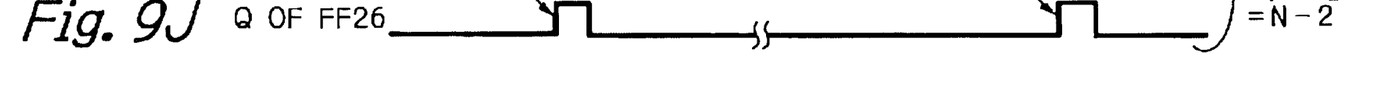

Thus, a pulse can be generated at any desired position during a horizontal scanning period by controlling the value of the signal $S_1(S_2)$. For example, if the value of the signal $S_1(S_2)$ is 0, the output of the decoder 25 and the Q output of the D-type flip-flop 26 are shown in FIGS. 9F and 9G. Similarly, if the value of the signal $S_1(S_2)$ is N−1, the output of the decoder 25 and the Q output of the D-type flip-flop 26 are shown in FIGS. 9I and 9J.

Figure 10:
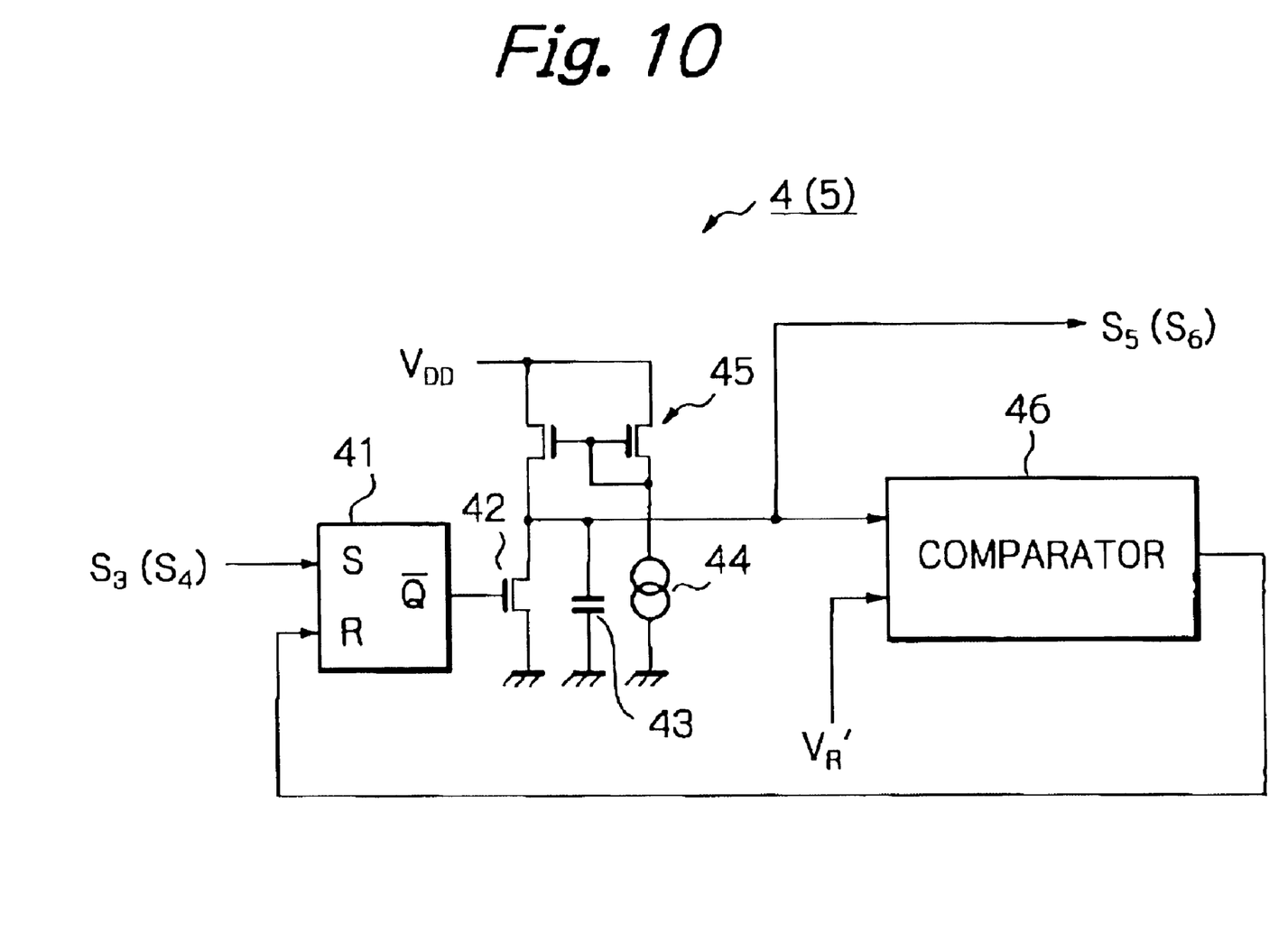
FIG. 10 is a detailed circuit diagram of the saw-tooth wave generation circuit of FIG. 6.
Figure 11A:
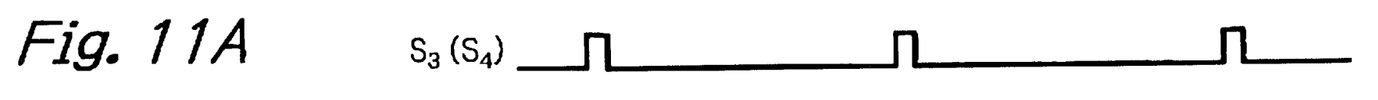
FIGS. 11A, 11B, 11C and 11D are timing diagrams for showing the operation of the saw-tooth wave generation circuit of FIG. 10.
Figure 11B:
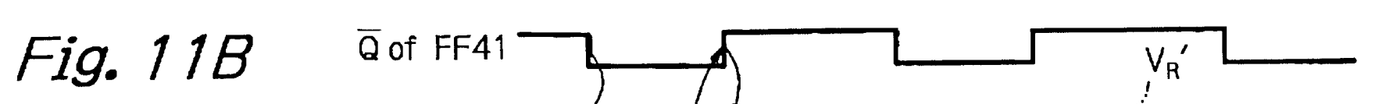

In FIG. 10, which is a detailed circuit diagram of the saw-tooth wave generation circuit 4(5) of FIG. 6, the output signal $S_3(S_4)$ of the horizontal position reference pulse generation circuit 2(3) as shown in FIG. 11A is input to the set input of an RS-type flip-flop 41. The inverted Q output of the RS-type flip-flop 41 as shown in FIG. 11B is input to the gate of N-channel MOS transistor 42 which is turned OFF when the inverted Q output of the RS-type flip-flop 41 becomes a low level. During the OFF period of the transistor 42, a capacitor 43 is electrically charged by an electric current controlled by a constant current source 44 and a current mirror circuit 45 to generate the saw-tooth wave signal $S_5(S_6)$ as shown in FIG. 11C.

Figure 11C:
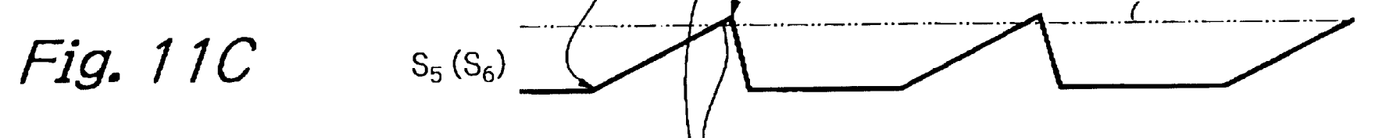
Figure 11D:
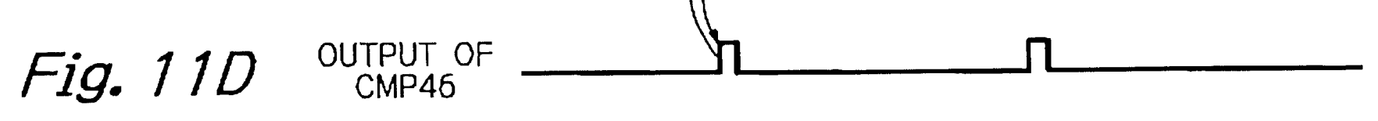

The saw-tooth wave signal $S_5(S_6)$ is input to one input terminal of a comparator 46, and a reference voltage $V_R'$ as shown in FIG. 11C is input to the other terminal thereof. When the level of the saw-tooth wave signal $S_5(S_6)$ exceeds the reference voltage $V_R'$, the output of the comparator 46 goes to a high level as shown in FIG. 11D.

The output of the comparator 26 is input to the reset input of the RS-type flip-flop 41. Therefore, when the output of the comparator 46 goes high in level as shown FIG. 11D, the inverted Q output of the RS-type flip-flop 41 is raised to a high level as shown in FIG. 11B, so that the transistor 42 is turned ON to electrically discharge the capacitor 43, and thus, the saw-tooth wave signal $S_5(S_6)$ is returned to 0V.

The operation of the horizontal scanning pulse signal control circuit is explained next with reference to FIGS. 12A through 12H.

Figure 12A:
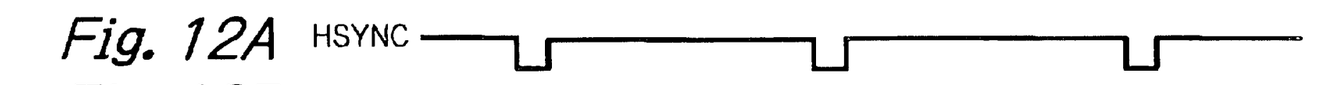
FIGS. 12A through 12H are timing diagrams for showing the operation of the horizontal scanning signal control circuit of FIG. 6.

When a horizontal synchronization signal HSYNC as shown in FIG. 12A is input to the reference clock generation circuit 1, the reference clock generation circuit 1 generates a reference clock signal $S_0$ in synchronization with the horizontal synchronization signal HSYNC (see FIGS. 9A and 9B). While the frequency of the horizontal synchronization signal HSYNC of a multi-scan type display apparatus is variable, the period of the reference clock signal $S_0$ is equal to that of the horizontal synchronization signal HSYNC divided by the frequency dividing ratio N because the frequency dividing ratio is held to a constant value. The reference clock signal $S_0$ is then input to the horizontal position reference pulse generation circuits 2 and 3.

The horizontal synchronization signal HSYNC is input to the horizontal position reference pulse generation circuit 2, so that counter 24 thereof counts up from 0 up to the value equal to the frequency dividing ratio less 1(N−1) by using the rising edge of the horizontal synchronization signal HSYNC as a reference point. The decoder 25 of the circuits determines whether or not the output of the counter 24 thereof is the horizontal position selection value of the signal $S_1$ and, when the two input values are found to be equal to each other, it outputs a pulse signal. The horizontal position selection value of the signal $S_1$ can take any desired value between 0 and the frequency dividing ratio less 1(N−1). The rising position of the horizontal scanning pulse signal $S_9$ as shown in FIG. 12H can be controlled by controlling the position of the pulse signal of the decoder 25 of the circuit 2 because this pulse signal determines a reference point for the rising edge of the saw-tooth wave signal $S_5$ that determines the rising edge of the horizontal scanning pulse signal $S_9$, as shown in FIGS. 12D, 12F and 12H. The signal for the horizontal position selection value $V_R$ can be controlled typically by means of a microcomputer.

The operation of the horizontal position reference pulse generation circuit 3 is the same as that of the horizontal position reference pulse generation circuit 2. The pulse width of the horizontal scanning pulse signal $S_9$ can be controlled by positionally controlling the pulse signal $S_4$ as shown in FIG. 12C because the output signal $S_4$ of the horizontal position reference pulse generation circuit 3 determines a reference point for the rising edge of the saw-tooth wave $S_6$ that determines the rising edge of the horizontal scanning pulse signal $S_9$, as shown in FIGS. 12C, 12E and 12H. While the horizontal pulse width selection value of the signal $S_2$ input to the horizontal position reference pulse generation circuit 3 can be controlled typically by means of a microcomputer, if the pulse width of the horizontal scanning pulse signal $S_9$ is made equal to 50% of the period of the horizontal synchronization signal HSYNC, a value obtained by adding half of the frequency dividing ratio N to the horizontal position selection value of the signal $S_1$ to be applied to the horizontal position reference pulse generation circuit 2.

Figure 12B:
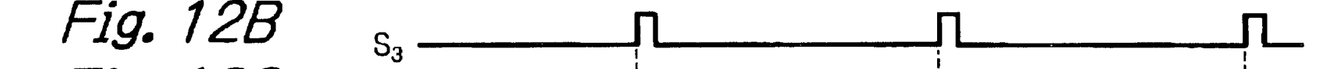
Figure 12C:
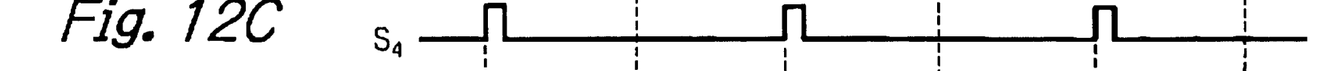
Figures 12D, 12E:
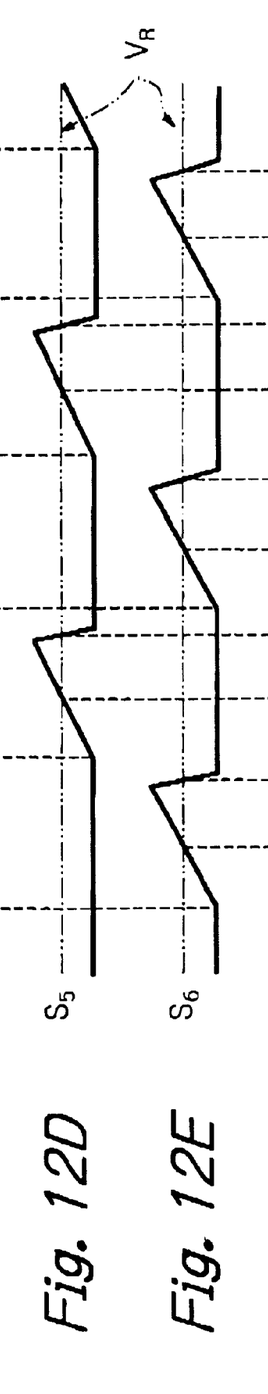
Figure 12F:
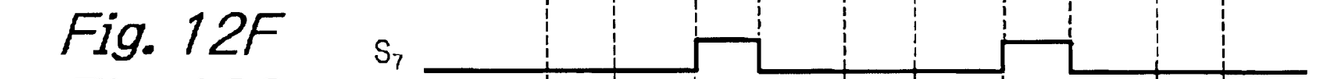

The output signal $S_3$ of the horizontal position reference pulse generation circuit 2 as shown in FIG. 12B is input to the saw-tooth wave generation circuit 4, which generates the saw-tooth wave signal $S_5$ as shown in FIG. 12D using the output of the horizontal position reference pulse generation circuit 2 as a reference. Similarly, the output signal $S_4$ of the horizontal position reference pulse generation circuit 3 as shown in FIG. 12C is input to the saw-tooth wave generation circuit 5, which generates the saw-tooth wave signal $S_6$ as shown in FIG. 12E using the output signal of the horizontal position reference pulse generation circuit 5 as a reference.

Figure 12G:
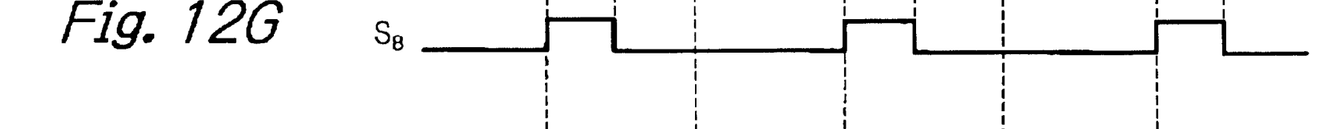
Figure 12H:
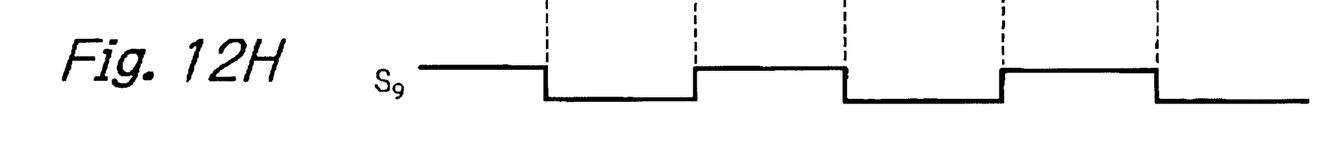

The output signals $S_5$ and $S_6$ of the saw-tooth wave generation circuits 4 and 5 are respectively input to the comparators 6 and 7. Each of the comparators 6 and 7 compares the input with the horizontal position selecting voltage $V_R$ and generates the pulse signal $S_7$ or $S_8$ as shown in FIG. 12F or 12G, whichever appropriate. A deflection correcting waveform is applied as the horizontal position selecting voltage $V_R$. For example, when a saw-tooth wave having a period equal to that of the vertical synchronization signal VSYNC as shown in FIG. 2A is applied, the voltage value to be compared with changes with the period of the vertical synchronization signal VSYNC, so that the position of the output pulse changes with the period of the vertical synchronization signal VSYNC to perform a parallelogrammatic correction as shown in FIG. 3B on the screen. On the other hand, when a parabolic wave signal having a period equal to that of the vertical synchronization signal VSYNC as shown in FIG. 4A is applied, a laterally pin-balanced correction as shown in FIG. 4B is carried out.

The output of the comparator 6 is input to the set input of the RS-type flip-flop 8. On the other hand, the output of the comparator 7 is input to the reset input of the RS-type flip-flop 8. Thus, as shown in FIGS. 12F, 12G and 12H, a horizontal scanning pulse signal $S_9$ having a rising edge and a falling edge respectively synchronized with the rising edges of the output signals of the comparators 6 and 7 is output from the output of the RS-type flip-flop 8. The pulse width of the horizontal scanning pulse signal $S_9$ is determined as the difference between the timing of the rising edge of the output signal $S_3$ of the horizontal position reference pulse generation circuit 2 as shown in FIG. 12B and that of the rising edge of the output signal $S_4$ of the horizontal position reference pulse generation circuit 3 as shown in FIG. 12C, because it is determined by the rising edge of the output pulse signal $S_9$ obtained by comparing the two saw-tooth wave signals $S_5$ and $S_6$ with the horizontal position selection voltage $V_R$, as shown in FIGS. 12E and 12F. Thus, the pulse width of the horizontal scanning pulse signal $S_9$ can be regulated with the level of accuracy within the error tolerance corresponding to a period of the reference clock signal $S_0$.

Figure 13:
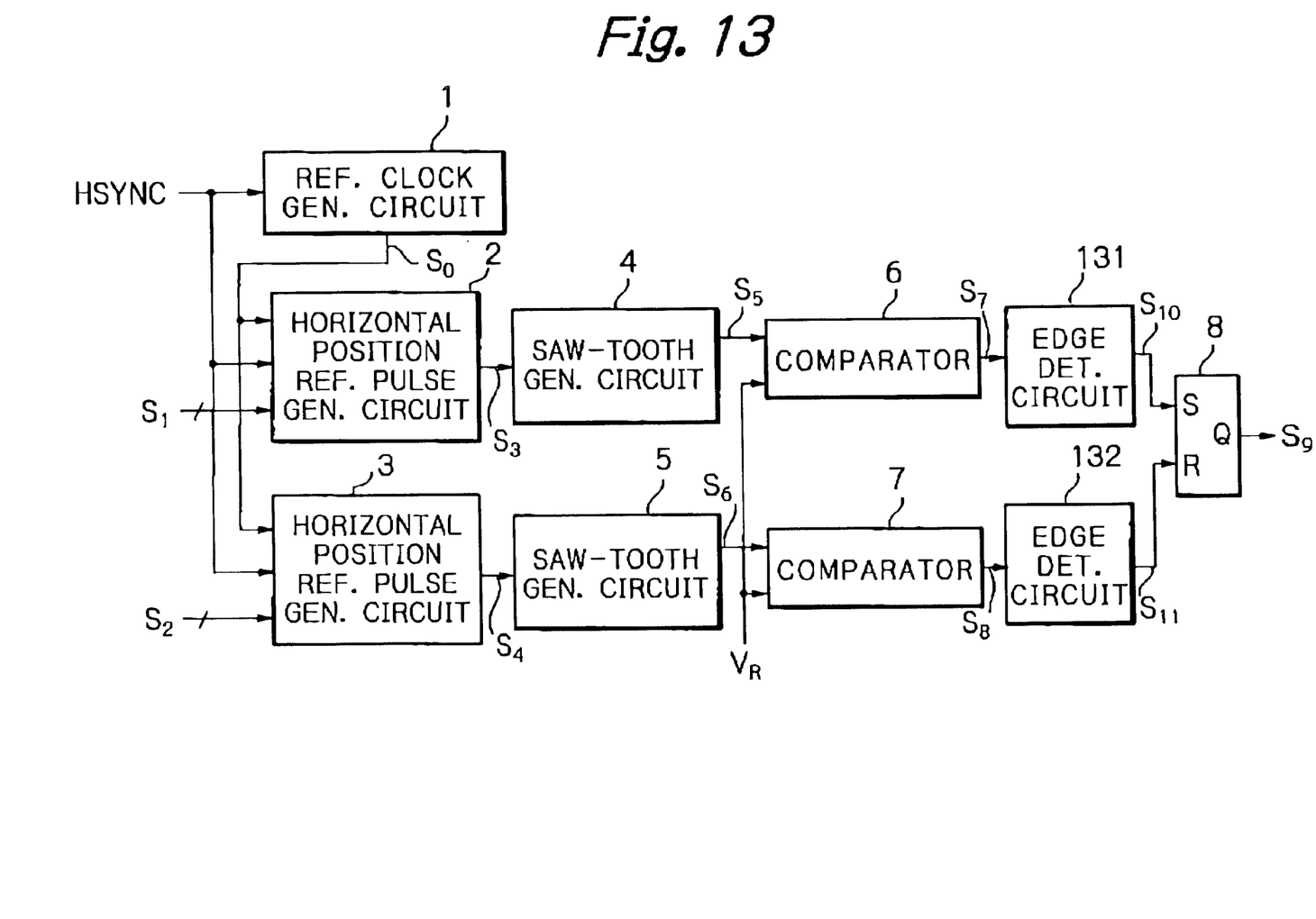
FIG. 13 is a block circuit diagram illustrating a second embodiment of the horizontal scanning pulse signal control circuit according to the present invention.

In FIG. 13, which illustrates a second embodiment of the present invention, an edge detection circuit 131 is interposed between the comparator 6 and the RS-type flip-flop 8 of FIG. 6, and an edge detection circuit 132 is interposed between the comparator 7 and the RS-type flip-flop 8 of FIG. 6. Note that FIGS. 14A through 14J show the operation of the circuit of FIG. 13.

Figure 14A:
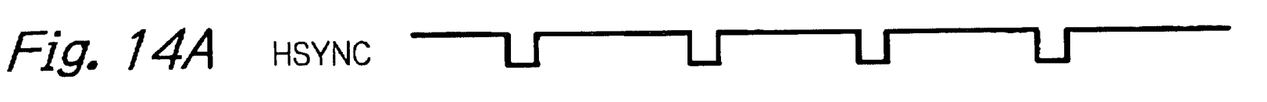
FIGS. 14A through 14J are timing diagrams showing the operation of the horizontal scanning signal control circuit of FIG. 13.
Figure 14B:
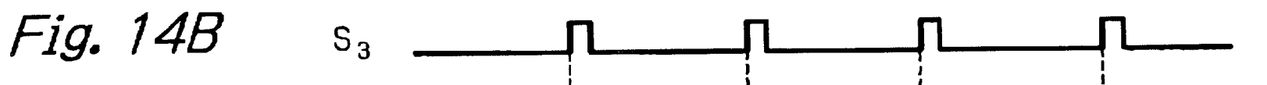
Figure 14C:
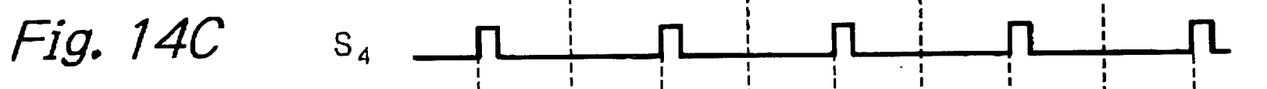
Figures 14D, 14E:
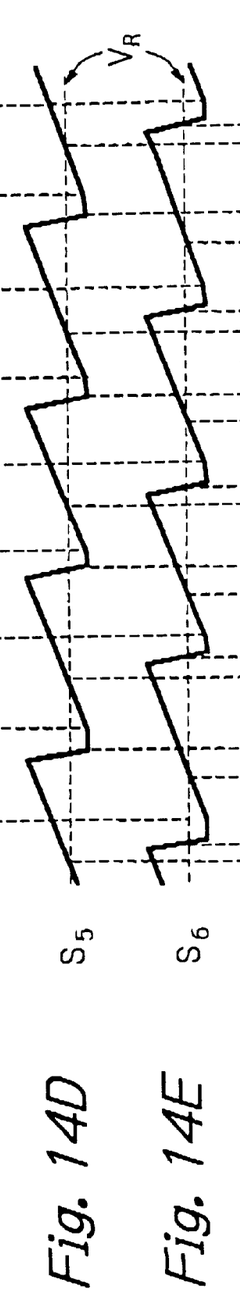
Figure 14F:
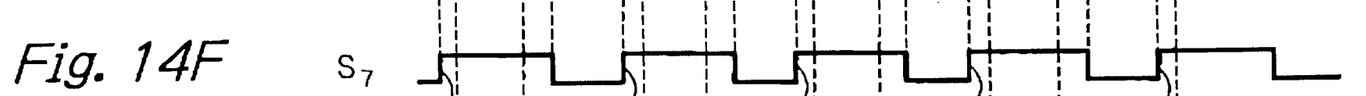
Figure 14G:
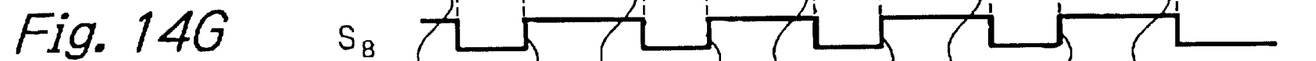
Figures 14H, 14I, 14J:
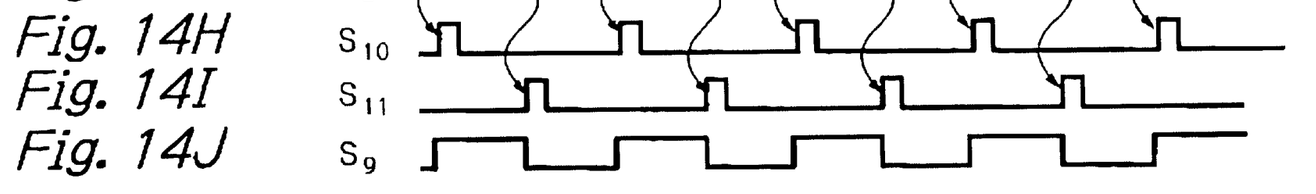

Various horizontal synchronization frequencies are input to a multi-scan type display apparatus. Therefore, as shown in FIGS. 14F and 14G, the output signals $S_7$ and $S_8$ of the comparators 6 and 7 will be overlapped when the horizontal synchronization frequency becomes high. Thus, the rising edge of the output signal $S_7$ of the comparator 6 and that of the output signal $S_8$ of the comparator circuit 7 are detected by the edge detection circuits 131 and 132, respectively, which in turn generate detection signals $S_{10}$ and $S_{11}$ as shown in FIGS. 14H and 14I. Since the detection signals $S_{10}$ and $S_{11}$ are pulsated, the detection signals $S_{10}$ and $S_{11}$ are hardly overlapped.

The detection signals $S_{10}$ and $S_{11}$ are supplied to the set input and reset input of the RS-type flip-flop 8, respectively, to adapt the circuit to high horizontal frequencies.

As explained hereinabove, according the present invention, since a horizontal scanning pulse signal control circuit according to the invention is designed to control the signal pulse width by means of a digital circuit, it is not directly affected by variances in performance of the various elements of the saw-tooth wave generation circuits including capacitors and resistors, and hence a horizontal scanning pulse signal having a stabilized pulse width can be obtained.

What is claimed is:

1. A horizontal scanning pulse control circuit comprising:
   a reference clock generation circuit for generating a reference clock signal in synchronization with a horizontal synchronization signal;
   first and second horizontal position reference pulse generation circuits, connected to said reference clock generation circuit, for generating first and second horizontal position reference pulse signals, respectively, whose phases are different with reference to said horizontal synchronization signal and corresponding pulses of said reference clock signal;
   first and second saw-tooth wave generation circuits, connected to said first and second horizontal position reference pulse generation circuits, respectively, for generating first and second saw-tooth wave signals in response to said first and second horizontal position reference signals, respectively;
   first and second comparators, connected to said first and second saw-tooth wave generation circuits, respectively, for comparing said first and second saw-tooth wave signals with a horizontal position selection voltage to generate first and second comparison signals, respectively; and
   an RS-type flip-flop, connected to said first and second comparators, said RS-type flip-flop being set and reset by said first and second comparison signals, respectively,
   an output signal of said RS-type flip-flop being used as a horizontal scanning pulse signal.

2. The horizontal scanning pulse signal control circuit as set forth in claim 1, further comprising:
   a first edge detection circuit, connected between said first comparator and said RS-type flip-flop, for detecting a rising edge of said first comparison signal to generate a first edge detection signal; and
   a second edge detection circuit, connected between said second comparator and said RS-type flip-flop, for detecting a rising edge of said second comparison signal to generate a second edge detection signal,
   said RS-type flip-flop being set and reset by said first and second edge detection signals.

3. The horizontal scanning pulse signal control circuit as set forth in claim 1, wherein said reference clock generation circuit comprises:
   a phase comparator for comparing a phase of said horizontal synchronization signal with a phase of a divided signal to generate a phase comparison signal;
   a voltage controlled oscillator, connected to said phase comparator, for generating said reference clock signal whose frequency is controlled by said phase comparison signal; and
   a frequency divider, connected between said voltage controlled oscillator and said phase comparator, for dividing a frequency of said reference clock signal to generate said divided signal.

4. The horizontal scanning pulse signal control circuit as set forth in claim 1, wherein each of said first and second horizontal position reference pulse generation circuits comprises:
   a first D-type flip-flop, connected to said reference clock generation circuit, for receiving said horizontal synchronization signal clocked by said reference clock signal;
   a second D-type flip-flop, connected to said first D-type flip-flop and said reference clock generation circuit for receiving an output signal of said first D-type flip-flop clocked by said reference clock signal;
   a NAND circuit, connected to said first and second D-type flip-flops, for performing a NAND operation upon an output signal of said first D-type flip-flop and an inverted output signal of said second D-type flip-flop;
   a counter, connected to said NAND circuits, and said reference clock generation circuit for counting pulses of said reference clock signal, said counter being reset by an output signal of said NAND circuit;
   a decoder, connected to said counter, for comparing a value of said counter with a horizontal position reference selection value and generating a pulse signal when the value of said counter coincides with said horizontal position reference selection value; and
   a third D-type flip-flop, connected to said decoder and said reference clock generation circuit, for receiving said pulse signal of said decoder clocked by said reference clock signal,
   an output signal of said D-type flip-flop being used as one of said first and second horizontal position reference signals.

5. The horizontal scanning pulse signal control circuit as set forth in claim 1, wherein each of said first and second saw-tooth wave generation circuits comprises:
   an RS-type flip-flop having a set terminal for receiving one of said first and second horizontal position reference signals;

an output terminal for generating one of said first and second saw-tooth wave signals;

a transistor connected between said output terminal and a ground terminal and controlled by an output signal of said RS-type flip-flop;

a capacitor, connected between said output terminal and the ground terminal;

a current supply circuit, connected to said output terminal, for supplying a current to said output terminal; and a comparator, connected to said output terminal, for comparing a voltage at said output terminal with a reference voltage, an output of said comparator being connected to a reset terminal of said RS-type flip-flop.

6. A horizontal scanning pulse control circuit comprising:

a reference clock generation circuit for generating a reference clock signal in synchronization with a horizontal synchronization signal;

first and second horizontal position reference pulse generation circuits, connected to said reference clock generation circuit, for generating first and second horizontal position reference pulse signals, respectively, whose phases are different with reference to said horizontal synchronization signal and corresponding to first and second pulses of said reference clock signal;

first and second saw-tooth wave generation circuits, connected to said first and second horizontal position reference pulse generation circuits, respectively, for generating first and second saw-tooth wave signals in response to said first and second horizontal position reference signals, respectively;

first and second comparators, connected to said first and second saw-tooth wave generation circuits, respectively, for comparing said first and second saw-tooth wave signals with a horizontal position selection voltage to generate first and second comparison signals, respectively;

first and second edge detection circuits, connected to said first and second comparators, respectively, for detecting rising edges of said first and second comparison signals to generate first and second edge signals, respectively; and an RS-type flip-flop, connected to said first and second edge detection circuits, said RS-type flip-flop being set and reset by said first and second edge detection signals respectively, an output signal of said RS-type flip-flop being used as a horizontal scanning pulse signal.

* * * * *